United States Patent
Tang et al.

(10) Patent No.: US 7,391,640 B2
(45) Date of Patent: Jun. 24, 2008

(54) 2-TRANSISTOR FLOATING-BODY DRAM

(75) Inventors: Stephen H. Tang, Pleasanton, CA (US);
Ali Keshavarzi, Portland, OR (US);
Dinesh Somasekhar, Portland, OR (US);
Fabrice Paillet, Hillsboro, OR (US);
Muhammad M. Khellah, Lake Oswego, OR (US); Yibin Ye, Portland, OR (US); Shih-Lien L. Lu, Portland, OR (US); Vivek K. De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 592 days.

(21) Appl. No.: 11/008,666

(22) Filed: Dec. 10, 2004

(65) Prior Publication Data

US 2006/0187706 A1    Aug. 24, 2006

(51) Int. Cl.
*G11C 11/24* (2006.01)
*G11C 11/34* (2006.01)

(52) U.S. Cl. .................. 365/150; 365/149; 365/182; 365/184

(58) Field of Classification Search ............. 365/150
See application file for complete search history.

(56) References Cited

U.S. PATENT DOCUMENTS

| 5,448,513 | A  | * | 9/1995  | Hu et al. ............... 365/150 |
| 5,784,311 | A  | * | 7/1998  | Assaderaghi et al. ...... 365/150 |
| 6,021,064 | A  | * | 2/2000  | McKenny et al. ........ 365/150 |
| 6,111,778 | A  | * | 8/2000  | MacDonald et al. ...... 365/149 |
| 6,266,269 | B1 | * | 7/2001  | Karp et al. ............. 365/150 |
| 6,538,916 | B2 | * | 3/2003  | Ohsawa ................. 365/149 |
| 6,560,142 | B1 | * | 5/2003  | Ando .................... 365/177 |
| 6,781,875 | B2 | * | 8/2004  | Ohsawa ................. 365/174 |
| 6,825,524 | B1 | * | 11/2004 | Ikehashi et al. .......... 257/314 |
| 6,873,539 | B1 | * | 3/2005  | Fazan et al. ............ 365/149 |
| 6,903,984 | B1 | * | 6/2005  | Tang et al. ........... 365/189.09 |

OTHER PUBLICATIONS

T. Ohsawa et al., Memory Design Using One-Transistor Gain Cell on SOI, 2002 International Solid-State Circuits Conference, p. 152.
S. Tang et al., Floating-Body DRAM with Two-Phase Write for Low Voltage Operation, Intel Invention Disclosure #31978, Apr. 2003, 3 pages.

* cited by examiner

*Primary Examiner*—Son L. Mai
(74) *Attorney, Agent, or Firm*—Ked & Associates, LLP

(57) ABSTRACT

A dynamic random access memory includes a cell having a circuit between a floating-body transistor and a bit line. Activation of the circuit is controlled to provide isolation between the floating body and bit-line voltage both during write operations and during times when the cell is unselected. The added isolation improves performance, for example, by reducing the need for gate-to-body coupling and the magnitude of voltage swings between the bit lines.

43 Claims, 11 Drawing Sheets

Substrate

|  | SOURCE | GATE 1 (WL1) | GATE 2 (WL2) | DRAIN (BL) |
|---|---|---|---|---|
| HOLD | LOW | LOW | LOW | LOW |
| WRITE "0" (DIODE ON) | LOW | MEDIUM | VERY LOW | VERY LOW ($V_{DIODE}$) |
| WRITE "1" (IMP. ION.) | LOW | HIGH | LOW | HIGH |

*FIG. 12*

|  | SOURCE | GATE 1 (WL1) | GATE 2 (WL2) | DRAIN (BL) |
|---|---|---|---|---|
| HOLD | LOW | LOW | LOW | LOW |
| WRITE "0" (DIODE ON) | LOW | LOW | LOW | VERY LOW ($V_{DIODE}$) |
| WRITE "1" (IMP. ION.) | LOW | LOW | HIGH | HIGH |

*FIG. 13*

2-TRANSISTOR FLOATING-BODY DRAM

BACKGROUND OF THE INVENTION

1. Field of the Invention

This invention relates to memory circuits, and more particularly to a memory cells formed from floating-body transistors and their applications.

2. Description of the Related Art

Integrating memory circuits (e.g., caches) on microprocessor dies is a power efficient way of achieving higher performance. In fabricating these dies, a direct correlation exists between memory cell density and performance; that is, performance generally increases with the number of cells in the memory. The degree of integration that can be achieved is not limitless and most often is constrained by memory type, the limited die space available for accommodating the memory circuits, and manufacturing costs as well as other practical considerations.

One memory type that has been proposed for integration onto a microprocessor die is SRAM memory. When implemented in large caches, each SRAM memory cell uses six transistors to read and write the data therein. This six-transistor configuration consumes considerable die space and thus leads to low memory cell density. This, in turn, places a significant limitation on microprocessor system performance, and for at least these reasons using SRAM cells to fabricate on-die caches is considered to be less than optimal.

Another memory type proposed for integration onto a microprocessor die is DRAM memory. As shown in FIG. 1, a conventional DRAM cell uses one transistor T and one capacitor C to control the storage of data therein. Switching of the transistor is controlled by the voltage state of a word line WL and data is conveyed along a bit line BL via a sense amplifier. Because fewer components are used, an on-die cache formed from this so-called 1T/1C structure has far greater cell density and data storage capacity than SRAM memory. In fact, DRAM cells can be ten times smaller in area compared with SRAM cells. For this reason, DRAM has been favored by chip designers over other types of memory for forming caches on microprocessor dies.

While they are favored, conventional DRAM caches are not without drawbacks. For example, the switching transistor and storage capacitor in each cell are implemented as separate elements. This necessarily reduces the cell density of the memory, which has an adverse affect on system integration and performance. Also, costly processing steps are required to make a capacitor in each cell that can store enough charge to maintain reasonable refresh times (e.g., typically at least 25 ff is needed).

A need therefore exists for a memory cell which has a higher density than other cells which have been proposed and which therefore may be relied on to improve, for example, the on-die integration of caches in microprocessor systems. A need also exists to construct a memory cell of this type at low cost using existing manufacturing technologies.

BRIEF DESCRIPTION OF THE DRAWINGS

FIG. 12 is a chart showing voltage states for the 2T DRAM cell when in a selected state.

FIG. 13 is a chart showing voltage states for the 2T DRAM cell when in an unselected state.

DESCRIPTION OF THE PREFERRED EMBODIMENTS

Figure 1:
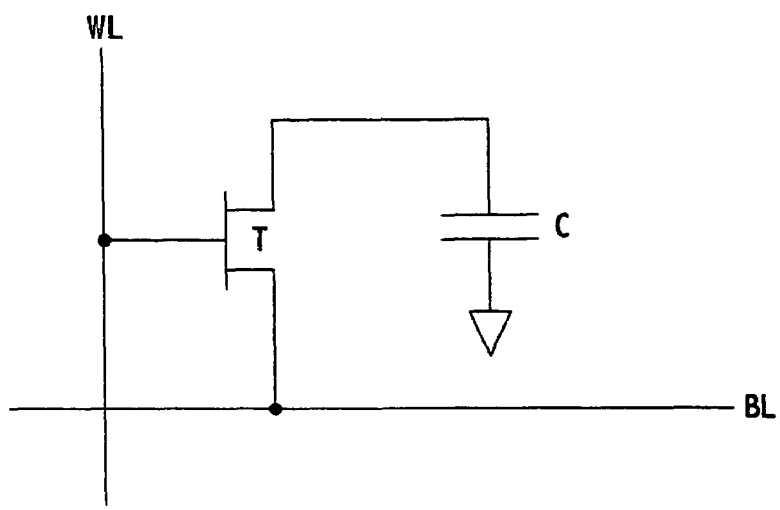
FIG. 1 is a diagram showing a DRAM cell having a so-called 1T/1C structure.
Figure 2:
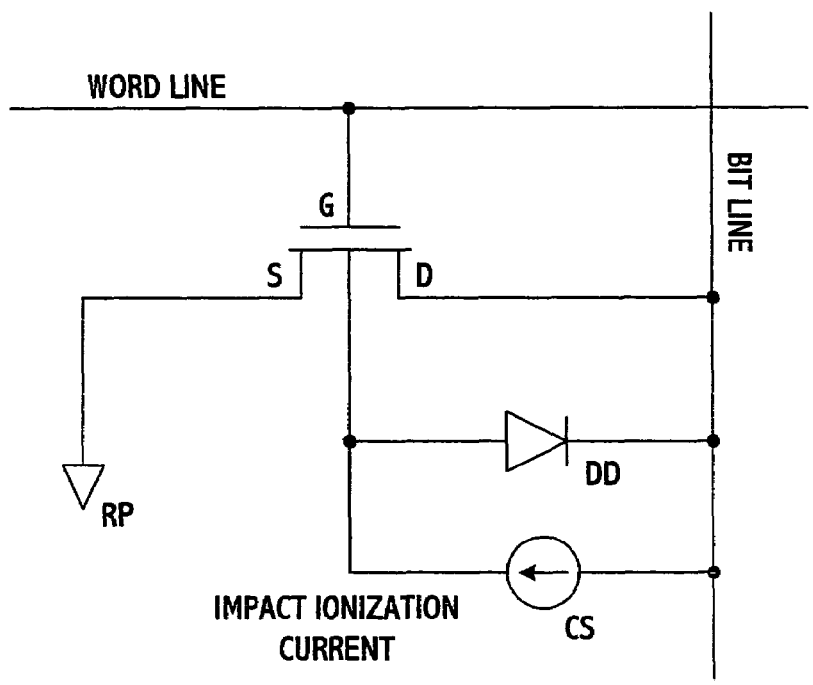
FIG. 2 is a diagram showing a first type of DRAM cell having a floating-body.

FIG. 2 is a diagram showing a first type of DRAM gain cell having a floating-body structure. The cell is formed from a single transistor having a source S connected to a reference potential RP (e.g., ground), a drain D connected to a bit line, and a gate G connected to a word line. A diode DD is provided to show a direction in which the drain junction is forward biased during a write "0" operation, and a current source CS is provided to show the direction in which impact ionization current flows when the transistor operates in a saturated operating region (i.e., when the drain voltage is greater than the gate voltage minus the threshold voltage, $V_g - V_T$) during a write "1" operation. As will become more apparent below, DD and CS are inherent to the transistor structure and are shown in FIG. 2 for explanatory purposes only.

Figure 3:
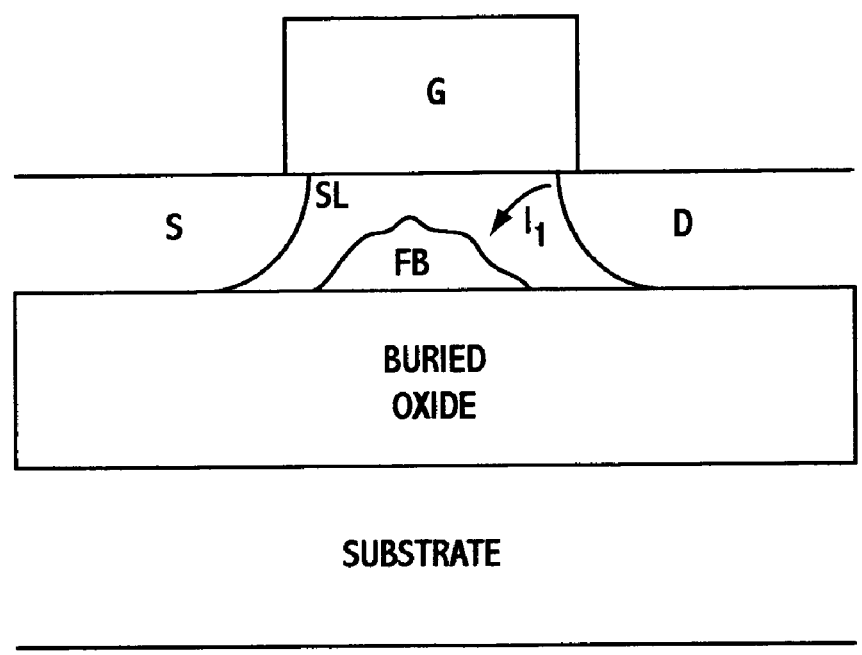
FIG. 3 is a diagram showing a cross-sectional view of the FIG. 2 cell which has a silicon-on-substrate structure.
Figure 3:
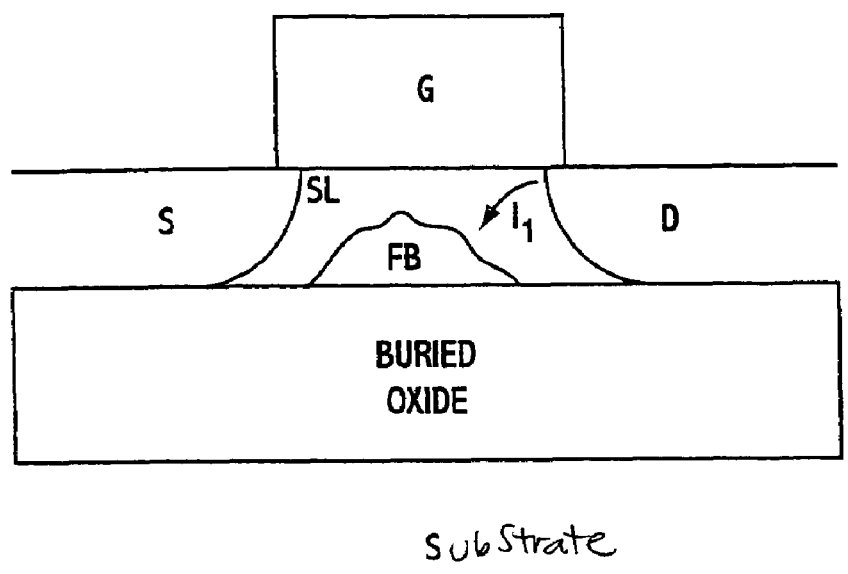

The transistor has a silicon-on-insulator (SOI) structure which, as shown in FIG. 3, includes an insulating layer (e.g., a buried oxide such as $SiO_2$) formed on a silicon substrate. A silicon layer SL is then formed over the insulating layer, and the gate is formed over the silicon layer with an intervening gate oxide film (not shown). When the silicon layer is made of p-type material, n-type diffusion regions are implanted into the silicon layer using known techniques to form the source and drain. The implantation process is controlled to ensure that the source and drain regions reach the underlying oxide layer and thus a channel is formed therebetween.

Depending on the thickness of the insulating layer, the channel region can be fully depleted or partially depleted. When the thickness of the insulating layer is smaller than the depletion depth, the transistor is in a fully depleted state. That is, full depletion exists when the total depletion charge exceeds the possible depletion charge limited by the thickness of the insulating layer. Otherwise, the transistor is in a partially depleted state. The substrate may correspond to a die containing other cells and/or microprocessor circuits.

The insulating layer induces formation of area under the depletion region called a body B. (Because the body is not directly connected to a fixed potential, it is considered to be floating and therefore has been labeled FB for "floating body.") Because the floating body is formed in the silicon layer, it may be referred to as a p-type floating body. Alternatively, the floating body may be made of an n-type material and the source and drain diffusion regions made from a p-type material.

Figure 4:
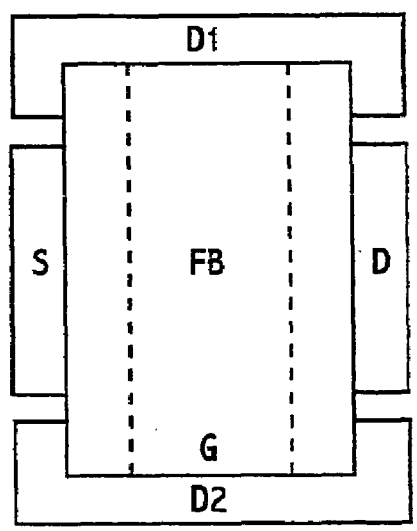
FIG. 4 is a diagram showing a top view of the FIG. 2 cell having the silicon-on-substrate structure.

The floating body is separated from the gate by the depletion region in the channel. If desired, lightly doped n-type regions (not shown) may be included under the gate and over the depletion region on either side of the channel. When arranged in this manner, the floating body is completely isolated by the insulating layer. As shown in FIG. 4, a pair of doped regions D1 and D2 may be aligned along the end portions of the floating body. These regions may be p-type bodies that make electrical connection to the floating body and thus allow electrical contacts to be formed.

Figure 5:
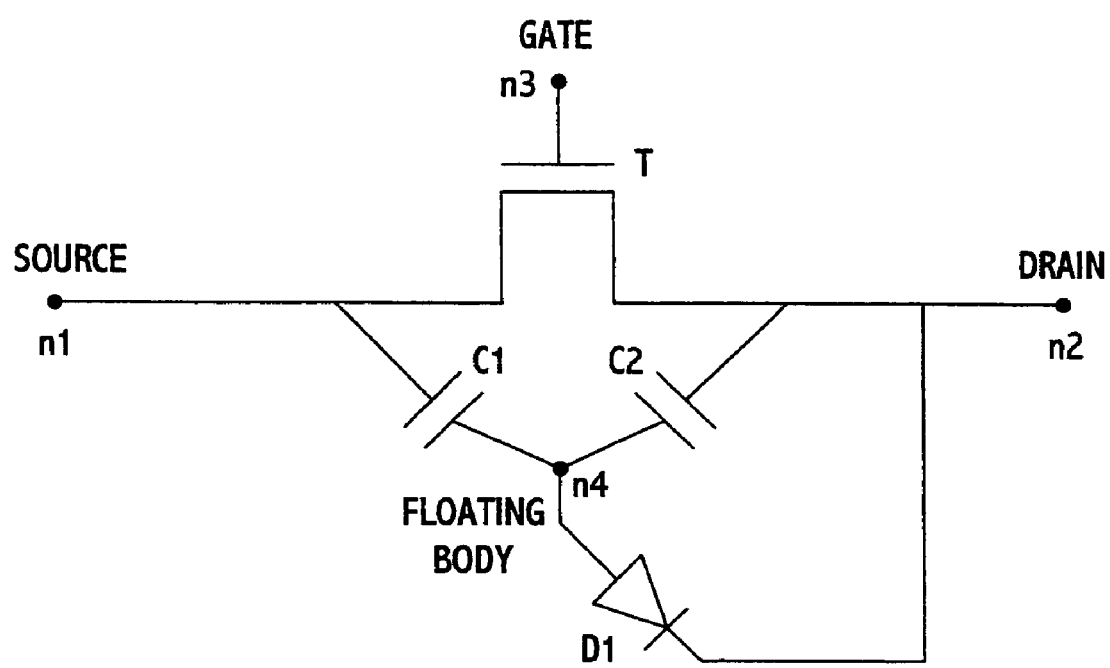
FIG. 5 is an equivalent circuit diagram of internal circuits formed by the SOI structure of the FIG. 2 DRAM cell.

FIG. 5 is an equivalent circuit diagram of internal circuits formed by the SOI structure of the DRAM cell. In this diagram the source, drain, and gate form a transistor T having corresponding nodes n1-n3, and the insulating layer induces formation of a virtual node n4 under the depletion region that corresponds to the channel body. A diode D1 is formed between node n4 and the drain and becomes forward biased when the voltage at n4 exceeds the drain voltage. In addition to these features, a gate-to-body capacitance exists and is relied upon for selecting the memory cell using word line and gate voltages. C1 and C2 represent source-to-body and drain-to-body parasitic capacitances which are considered undesirable.

In operation, the DRAM cell charges and discharges the channel body to produce a voltage at node n4 which correspond to a digital data value of "1" or "0." The amount of charge stored in the channel body thus determines the state of the cell. A more detailed discussion of the write and read operations for the cell now follows.

To write data in the cell, the body is either discharged by forward biasing the drain-to-body diode or charged by impact ionization current, respectively shown as DD and CS in the equivalent circuit diagram of FIG. 2. That is, to write "1" in the cell, the word line is asserted and then charge is pumped into the body by impact ionization current created by voltage on the bit line. Conversely, to write a "0" in the cell, the word line is reduced in voltage and the channel body is discharged when the drain diode is forward biased. A more detailed explanation of the internal operation of the cell during a write operation will now be given.

Figure 6A:
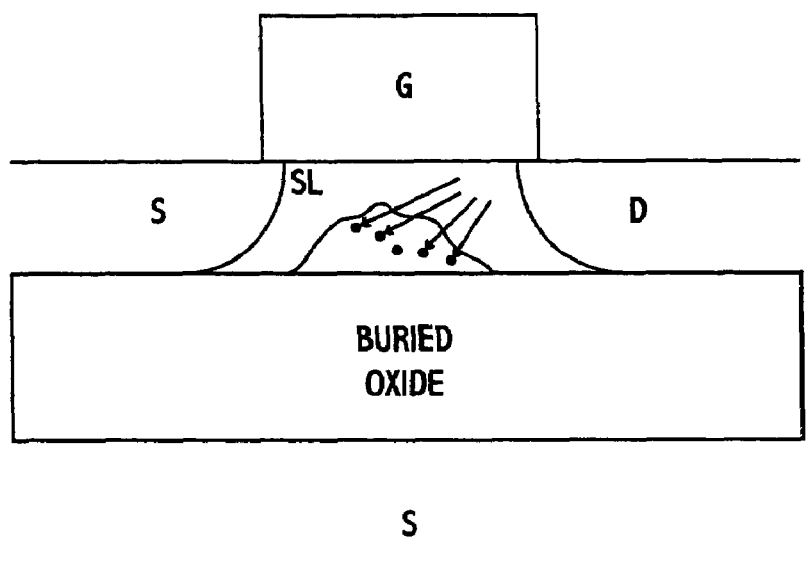
FIG. 6A is a diagram showing how the channel body of the transistor is charged during a write "1" operation.

Writing data into the cell is performed based on the accumulation of holes which serve as majority carriers in the floating channel body. When the gate voltage exceeds its threshold and the bit line assumes a digital "1" voltage, the transistor operates in the saturated region and impact ionization current begins to flow from an area near the drain. (See the current labeled $I_1$ in FIG. 3). Holes produced by the impact ionization current flow as majority carriers into the channel body, thereby developing a potential in the body which corresponds to digital "1." The migration of holes into the body which corresponds to this cell state is shown in FIG. 6A, where the block dots are the holes.

Figure 6B:
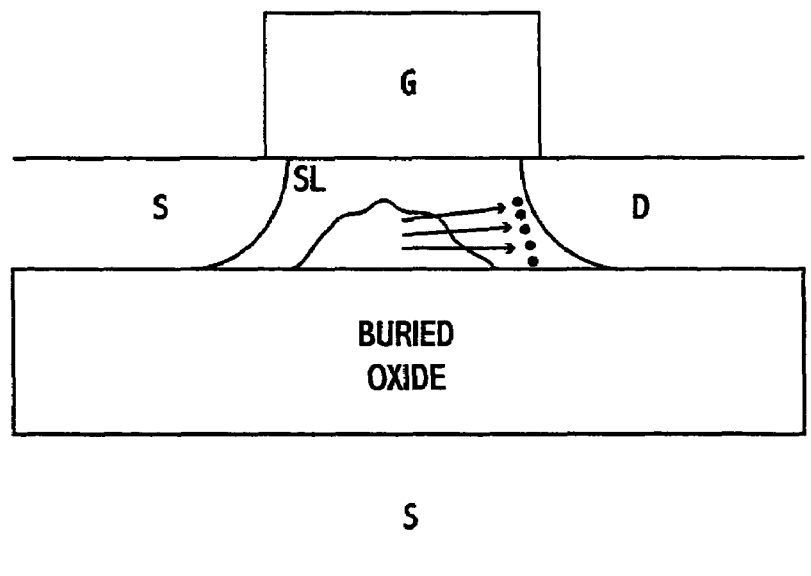
FIG. 6B is a diagram showing how this channel body is discharged during a write "0" operation.

When the gate voltage falls below its threshold and the bit line assumes a digital "0" value, the pn junction between the drain and the silicon layer is forward biased; that is, the body-to-drain diode DD is turned on. As a result, the holes in the body flow to the drain side of the transistor, thereby causing the body to develop a charge corresponding to digital "0". The migration of holes to the drain side which produces this cell state is shown in FIG. 6B.

During this write "0" operation, the diode may be forward biased even though the gate has not exceeded its threshold value. The cell depends on capacitive coupling from the gate to the body in order to boost the body voltage of the selected row higher. Without this body voltage boost from the selected word line, it may be more difficult to differentiate between the bodies of selected and unselected rows (this relates to the write disturb issue discussed herein). In accordance with at least one embodiment of the present invention, the gate voltage may be stopped at the threshold voltage ($V_t$), since once $V_t$ is reached an inversion layer forms and the body is shielded from gate coupling. Going higher than $V_t$ may not boost the body voltage any further.

Figure 7:
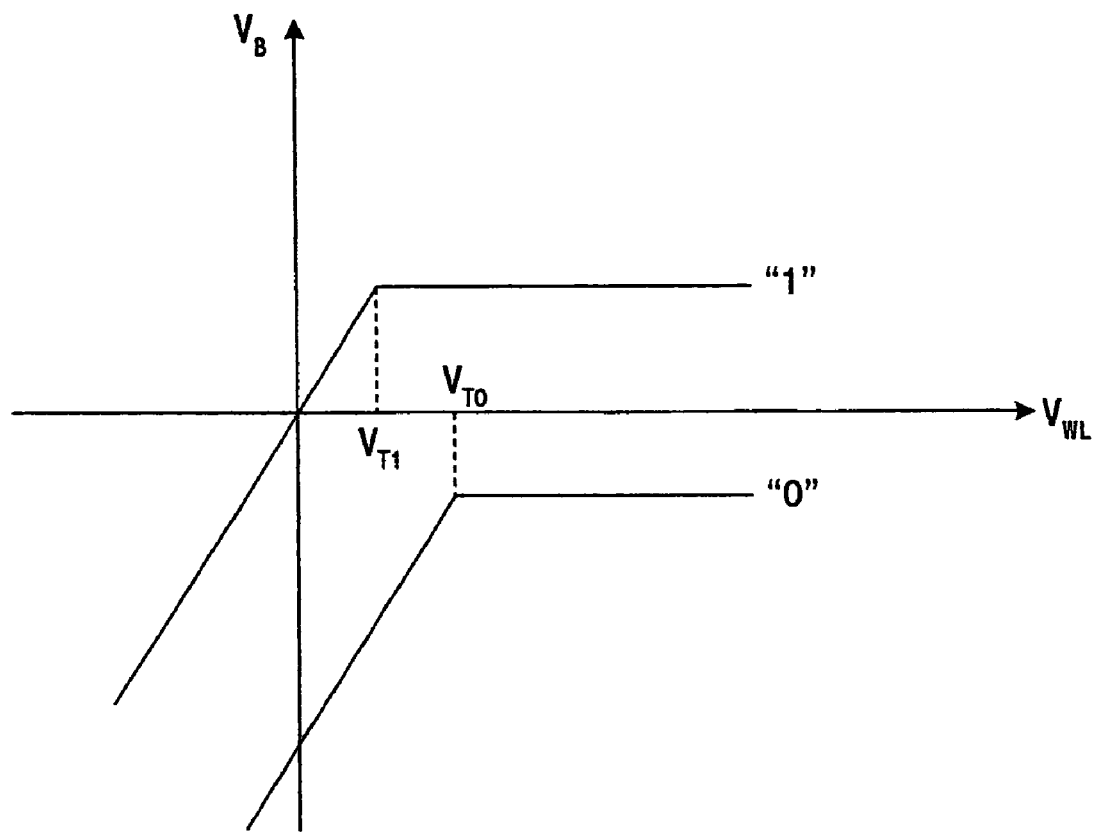
FIG. 7 is a diagram showing channel body potentials which correspond to different cell states.

A digital "1" or "0" is therefore stored as a difference in the potential of the channel body. As shown in FIG. 7, when the channel body assumes a higher potential $V_{T1}$ due to hole accumulation, the cell assumes a digital "1" state. And, when the channel body assumes a lower potential $V_{T0}$ due to the absence of holes, the cell assumes a digital "0" state. Here, $V_{WL}$ corresponds to the word line voltage connected to the gate and VB corresponds to the bit line voltage. Note that when the cell is in a "1" state, the threshold voltage is lower than when in the "0" state; that is, $V_{T1} < V_{T0}$. Thus, the current of the cell in a "1" state is higher than when in a "0" state through the body effect.

In order to hold the "1" in the cell, a negative bias voltage may be applied to the word line to hold the accumulation of holes in the channel body. In theory, this data hold state is not changed even when a read operation is performed, as long as the read operation is performed in a linear region unless a write operation of inverted data (erase operation) is performed.

To read data from the cell, the body effect modulates the on-state current of the transistor. By detecting this current, the cell state (e.g., stored data), which is determined by the potential stored in the body, may be sensed. A read operation may therefore be performed by detecting a difference in bit line current when the bit line is clamped at a predetermined potential. The difference in bit line current under these conditions will determine whether a "1" or "0" is stored in the cell.

The aforementioned DRAM cell therefore uses a single element in the form of a floating body transistor to perform the functions of both a storage capacitor and switching transistor. By eliminating the need to use a separate storage capacitor, memories constructed from these cells can achieve higher densities compared with the conventional 1T/1C DRAM structure. This allows microprocessor chips having on-die caches to achieve a higher level of integration and performance. In the foregoing discussion, the DRAM cell is described as having an SOI structure. If desired, the cell may be implemented using bulk silicon technology using either floating n-wells or shallow-well technology.

Notwithstanding its improvements over the 1T/1C structure, the DRAM cell described above has a number of drawbacks. First, this cell requires a large gate-to-body coupling in order to properly select cells and prevent write disturbs. This means that gate-to-body capacitance should be the dominant component of overall body capacitance. This is true in SOI, where the buried oxide eliminates the substrate-to-body capacitance and the areal component of the source/drain-to-body capacitance, but this is not true when bulk silicon is used.

Second, when implemented using bulk silicon in a memory array, retention time of the floating body cell is extremely short because unselected cells suffer severe disturbs during a write operation. For example, a cell storing a digital "1" value partially discharges when another cell in the same column is written with a digital value of "0." Consequently, the cell storing the partially discharged "1" loses its state much sooner, which means it has a shorter retention time. These effects have been may be undesirable when attempting to construct a performance-efficient memory.

Third, large voltage swings between the word and bits lines undermine the ability to integrate floating-body DRAMs into standard CMOS processes. These swings occur in at least two situations, both of which are apparent from the chart of FIG. 8 and the illustrative matrix of cells shown in FIG. 9. (In both figures, it is assumed that an NMOS transistor is used in each cell).

The first adverse voltage swing occurs between the word line of unselected cells and the bit line of selected cells during a write "1" operation. In order to hold a digital value in unselected Cell $1_1$, a "very low" (or negative bias) voltage 10 is applied to word line WL1. When Cell $2_1$ is selected as a result of WL2 going high during a write "1" operation, both unselected Cell $1_1$ and selected Cell $2_1$ receive a "high" voltage 20 on bit line BL1, by virtue of Cell $1_1$ and Cell $2_1$ being in the same column of the matrix. A large voltage swing therefore develops between the gate ("very low") and drain ("high") of the unselected cell at this time.

The second adverse voltage swing occurs between the word and bit lines of a selected cell during a write "0" operation. During this operation, the word line of the cell assumes a "high" voltage and the bit line of the cell assumes a "very low" voltage, as reflected by reference numeral 30 in FIG. 8.

The large voltage swings that develop in these situations may cause process-imposed limitations on supply voltage to be exceeded, which, in turn, will negatively affect memory reliability. To offset these effects, the maximum supply voltage can be increased. However, increasing this voltage will decrease scaling since oxide layers must be thinned and junctions must be more highly doped.

Figure 10:
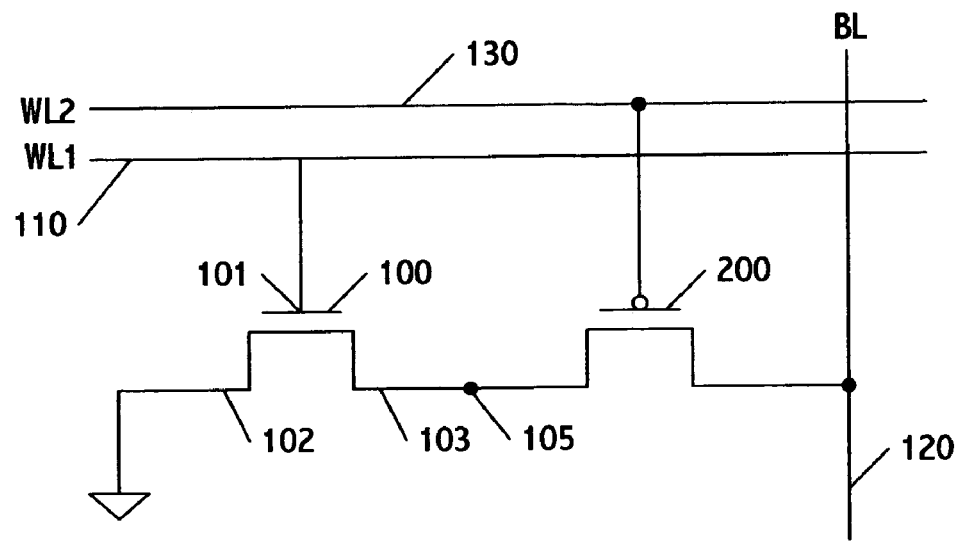
FIG. 10 is a diagram of a second type of DRAM cell having a 2T structure implemented using SOI NMOS technology.

FIG. 10 shows a second type of DRAM cell having a floating-body structure. This cell has at least one circuit element that isolates its word and bit lines, both when the cell is selected and unselected during a memory write operation. This circuit element also solves the selection problem previously discussed when there is inadequate gate-to-body capacitance.

In accordance with one embodiment, the cell includes two transistors, the second of which provides the isolation required to prevent at least one and preferably both of the large voltage swings that occur in the first type of DRAM cell. The first transistor 100 includes a gate 101 coupled to a first word line 110, a source 102 coupled to a reference potential (e.g., ground), and a drain 103 coupled to a one of a plurality of bit lines 120 in the memory circuit. The first transistor also includes a floating body as previously described for storing cell data.

The second transistor 200 isolates bit line 120 from word line 110, and a node 105 couples the drain of the first transistor to a source of the second transistor. The polarity of the second transistor is preferably different from the first transistor, e.g., in FIG. 10 transistor 100 is an NMOS transistor and transistor 200 is a PMOS transistor. In alternative embodiments, the opposite may be true. The gate of the second transistor is coupled to a control line (which may be referred to as a second word line) labeled 130 situated parallel to the first word line.

Figure 11:
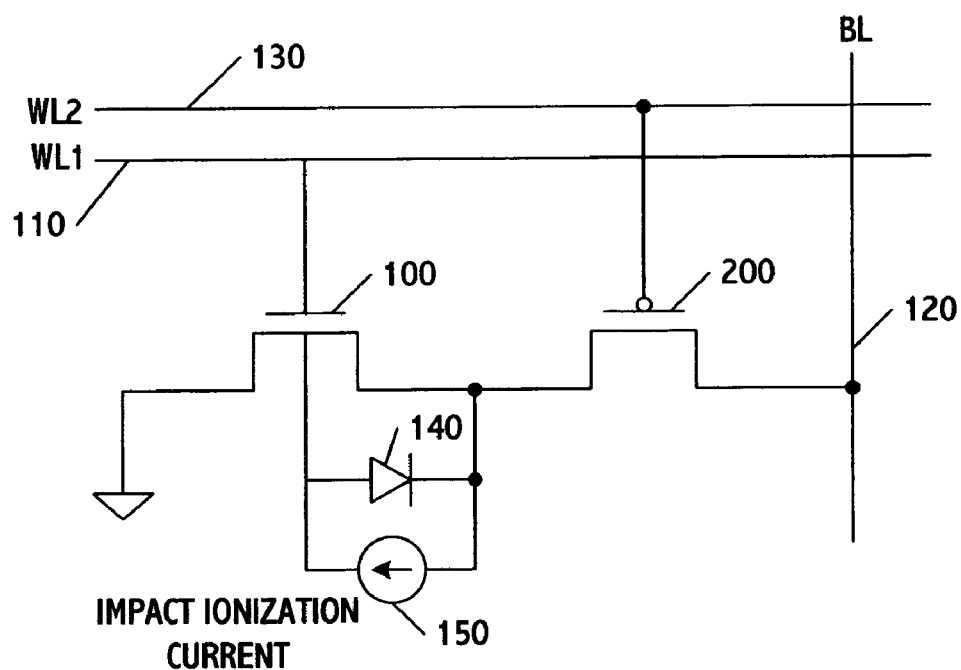
FIG. 11 is an equivalent circuit diagram of the second type of DRAM cell shown in FIG. 10.

FIG. 11 shows an equivalent circuit diagram of the 2T-type cell shown in FIG. 10. This diagram includes a virtual diode 140 which shows a direction in which the drain junction is forward biased relative to the floating body during a write "0" operation, and a virtual current source 150 which shows the direction in which impact ionization current flows relative to the floating body during a write "1" operation.

Operation of the 2T cell when the cell is selected and unselected will now be described. Referring to FIG. 12, in order to select the cell, the first word line 110 may assume a moderate ("medium") voltage and the second word line 130 assumes a lower voltage. These voltages turn on both transistors, thereby allowing a digital value corresponding to the bit-line voltage to be stored in the first-transistor floating body. The "medium" and lower voltages may be applied to the word lines at the same or different times. If at different times, the second word line is preferably asserted first to ensure isolation between the bit line and first word line. For some applications, it may be possible to set the first word line to a different voltage state (to a state different from "medium") because the "very low" state of the bit line may be sufficient to forward bias the diode.

Selected Cell Isolation

To write a "0" in the cell, the second word line preferably assumes a "very low" voltage which turns on transistor 200. The bit-line voltage may also assume a "very low" voltage, which is then transferred to the drain of the first transistor through the second transistor. When taken in combination with the gate voltage, the "very low" voltage causes the virtual diode 140 to become forward biased. This causes the channel body of the first transistor to discharge as a result of holes migrating from the body to the drain side of the transistor. The floating body therefore develops a charge (or lack thereof) which corresponds to a digital value of "0." During this time, and preferably during all phases of operation, the source of the first transistor remains at a "low" voltage by virtue of its coupling to the reference potential.

The second transistor, thus, provides a level of isolation sufficient to allow for a reduction in the voltage swing between the first word line and bit line of the first transistor in a selected cell. This may be seen by comparing the gate and drain voltages of transistor 100 in FIG. 11 with the gate and drain voltages in FIG. 8 for a write "0" operation. This comparison shows that the inclusion of transistor 200 allows the gate-to-drain voltage swing of the first transistor to be reduced to the difference between "medium" and "very low" voltages, from the larger voltage swing of "high" to "very low" in FIG. 8. The isolation provided by the second transistor also allows the gate voltage for the first transistor to assume a "low" value, as compared to "very low," during a hold state.

To write a digital value of "1" in the cell, the second word line preferably assumes a "low" voltage which turns on transistor 200. The first word-line and bit-line also assume a "high" voltage, which is then transferred from the bit line to the drain of the first transistor through the second transistor. When taken in combination with the gate voltage, the "high" voltage causes impact ionization current to flow from an area near the drain to the body of the first transistor. As a result, holes produced by the impact ionization current migrate as majority carriers into the body, thereby charging the body to a digital value of "1."

Typically, in a write "1" operation the word line voltage does not depend on whether a "0" or "1" is written. However, in at least one embodiment of the present invention the write operation is divided into two parts. In what is referred to as a "two-phase write" operation, first logical 0s are written and then logical 1s are written (or vice versa). It may take longer to complete such a write scheme because it is performed in two phases, but this scheme allows different voltages to be on the word lines, which is at least one way the improved level of performance described herein may be attained.

To hold a digital value in the cell, the voltages of both word lines and the bit line may assume a "low" value. Even though the second transistor is turned on under these circumstances, the low voltage is preferably below the threshold value of the first transistor to thereby ensure that transistor 100 is turned off. This prevents voltage stored in the body from dissipating into the bit line.

Unselected Cell Isolation

Figures 8, 9:
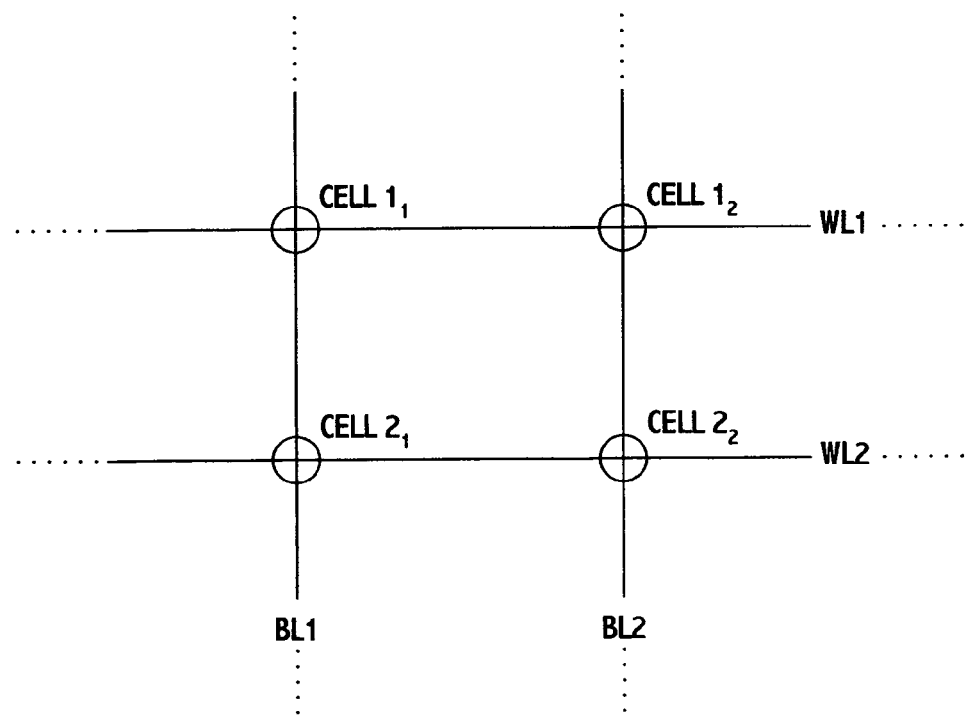
FIG. 8 is a chart showing voltage states that a floating-body transistor may assume in the first type of DRAM cell.
FIG. 9 is a diagram of a memory cell array.

To prevent large voltage swings from occurring in cells which are not selected but which are coupled to a bit line of one or more selected cells, voltages set forth in the chart of FIG. 13 may be applied. As shown in FIG. 9, unselected and selected cells may be coupled to a same bit line when, for example, they are in the same column of the memory matrix. When connected in this manner, the second transistor 200 in each cell prevents the voltage on an activated bit line from adversely affecting an unselected cell during a write "1" operation.

During a write "1" operation, bit line 120 assumes a "high" voltage to enable a digital "1" to be written into a selected cell. To prevent the high voltage of this bit line from affecting the unselected cell, a "high" voltage is applied to word line 130. This high value turns off transistor 200 of the unselected cell to thereby isolate first transistor 100 from the high voltage on the bit line. The first word line also preferably assumes a "low" voltage state during this time. The source voltage of the first transistor may also be kept low by virtue of the reference potential.

The second transistor, therefore, provides a level of isolation sufficient to allow for a reduction in the voltage swing between the bit line of a selected cell and the first word line of an unselected cell coupled to the same bit line. This may be seen by comparing the gate voltage first transistor 100 of an unselected cell (in a hold state) and the bit-line (drain) voltage of a selected cell during a write "1" operation (respectively labeled 210 and 220 in FIG. 11) with corresponding gate and bit-line voltages of unselected and selected cells labeled 10 and 20 in FIG. 8. This comparison shows that the inclusion of transistor 200 allows the voltage swing between first-transistor gate voltage of an unselected cell (in hold state) and the bit-line voltage of a selected cell to be reduced to the difference between "low" and "high" voltages, from the larger voltage swing of "very low (accumulated)" to "high" in FIG. 8.

By reducing the voltage swing in each cases discussed above, the 2T cell prevents process-imposed limitations on supply voltage from being exceeded. As a result, the maximum supply voltage for the floating-body DRAM can be maintained at low levels, thereby promoting higher-level scaling and integration with standard CMOS processes. Also, through the isolation transistor, a strong gate-to-body coupling is no longer necessary in order to properly select cells to be written, and write disturbs are also minimized. These improvements are further enhanced by writing digital "0" values separately from digital "1" values, which may be referred to as two-phase writing scheme.

For all embodiments of the present invention, the values of "very low," "low," "medium," and "high" in the charts of FIGS. 8, 12, and 13 may vary depending on the application. As a non-limiting example, consider an implementation in 0.18 um CMOS technology. In this case, "very low" may be −1.8 V, "low" may be 0 V, "medium" may be 0.5 V, and "high" may be 1.8 V. Relative to threshold voltage, another non-limiting example might set the "very low" and "low" voltages below the threshold voltage of the transistors. In this case, "very low" may correspond to a voltage below a reference potential (e.g., ground) and "low" may be equal or substantially equivalent to the reference potential.

Figure 14:
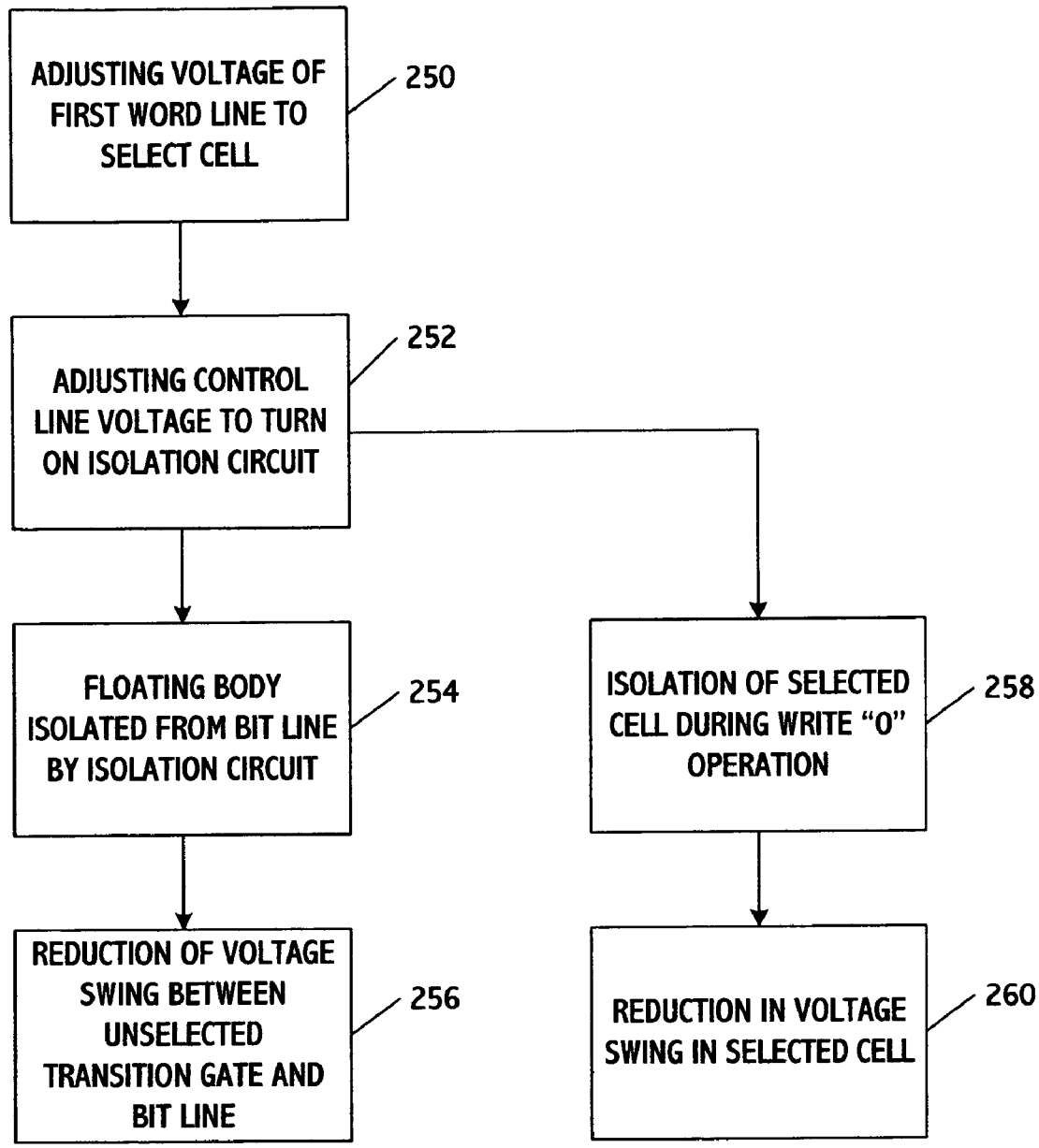
FIG. 14 is a flow diagram showing functional blocks included in method for controlling a memory array having one or more 2T cells.

FIG. 14 shows functional blocks that may be included in a first embodiment of a method for controlling a memory, including but not limited to one having the 2T cell structure discussed above. The method includes adjusting voltage of a first word line to place a cell in an unselected state (Block 250). A circuit between a first transistor of the unselected cell and a bit line may then be controlled to isolate data stored in a floating body of the first transistor from a voltage applied to the bit line. This may be accomplished by adjusting voltage of a control line coupled to the circuit. (Block 252). The control line is preferably different from the word line, and the isolating circuit may include a second transistor such as transistor 200 previously discussed. In alternative embodiments, other isolating circuits or circuit elements may be used including any one of a variety of logic circuits including but not limited to multiplexers.

Once activated, the isolating circuit prevents the bit line voltage from adversely affecting the floating body during times when the cell is unselected and another cell coupled to the same bit line is being written to. (Block 254). The isolating circuit also allows for lower voltage swings between the bit and controls lines, for example, as previously described with reference to FIGS. 12 and 13. (Block 256).

The isolating circuit may also be activated when the cell is selected during a write "0" operation. (Block 258). During this time, the voltage state of the floating-body transistor gate may be lowered to reduce voltage swing relative to the bit-line voltage. (Block 260).

Figure 15:
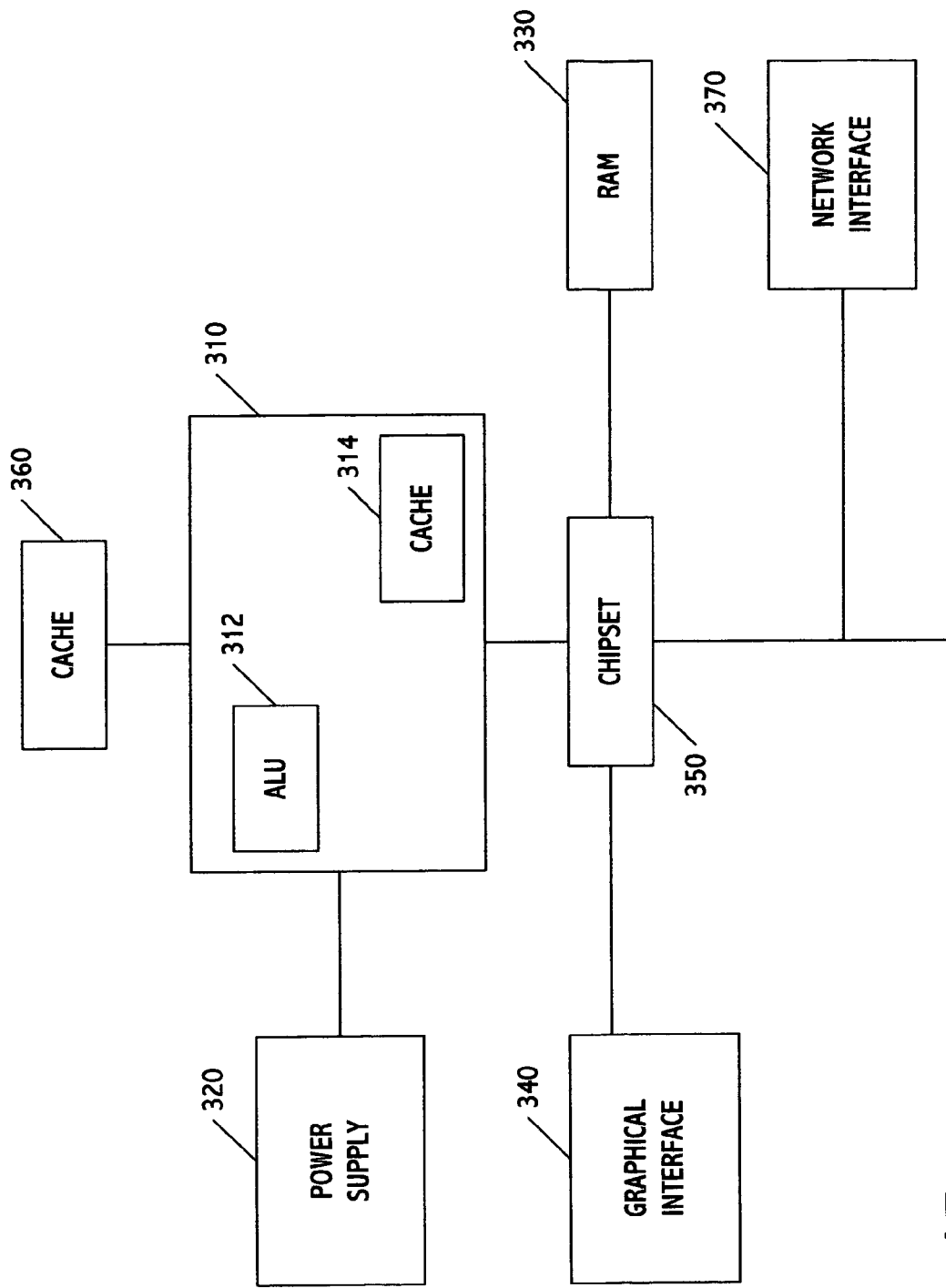
FIG. 15 is a diagram showing a processing system which includes one or more caches or other memory devices formed from any of the DRAM cells described herein.

FIG. 15 is a diagram showing a processing system which includes a processor or controller 310, a power supply 320, and a memory 330 which, for example, may be a random-access memory. The processor includes an arithmetic logic unit 312 and an internal cache 314. The system also preferably includes a graphical interface 340, a chipset 350, a cache 360, and a network interface 370. The processor may be a microprocessor or any other type of processor. If the processor is a microprocessor, it may be included on a chip die with all or any combination of the remaining features, or one or more of the remaining features may be electrically coupled to the microprocessor die through known connections and interfaces. The internal cache 314, cache 360, and/or memory 330 may be formed from any of the floating body DRAM cells described herein. When implemented in this manner, the processing system is able to achieve improved performance over conventional devices.

The SOI structures described herein may be formed using any one of a variety of techniques including separation by implanted oxygen (SIMOX), zone melting and recrystallization (AMR), and bonded and etchback (BESOI) to name a few.

In addition to benefits previously discussed, the embodiments of the present invention may realize improved performance in other ways. For example, some applications may require the forward-biased diode and impact ionization current to have large voltages (e.g., >0.7V) in order to yield adequate current to charge/discharge the floating body. Conventionally, it was difficult to achieve both simultaneously without using large voltage swings.

The embodiments of the present invention may be implemented to reduce these voltage swings through use of the second cell transistor. Although this transistor adds to the cell area, it extends scalability of the memory to future process technologies having more severe voltage restrictions. This benefit alone is expected to offset the area penalty imposed by the second transistor.

The embodiments of the present invention may also be implemented to individually optimize voltages used for performing write "0" and write "1" operations. This may prove to be important when the application does not provide large voltage headroom. Also, by eliminating the write disturb problem, a memory using the 2T cell structure described herein will be able to achieve improved retention time, which will translate into a reduction in the amount of bandwidth wasted by refresh operations and an increase in the bandwidth available for useful read and write operations. All of these effects will improve the functionality of the overall memory array.

Also, compared to conventional 6T SRAMs, a 2T FBDRAM cell allows more cache memory to be integrated with a microprocessor. This improves processor performance efficiently, both in terms of area and power, which ultimately translates to lower cost. In addition, an FBDRAM including the 2T cell structure can be implemented with little or no change to a standard CMOS process flow. Such a memory therefore will be ideal for use in applications having supply voltage limitations that use aggressive gate-oxide thickness and junction doping, as well as for use in bulk silicon products.

Any reference in this specification to an "embodiment" means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Furthermore, for ease of understanding, certain functional blocks may have been delineated as separate blocks; however, these separately delineated blocks should not necessarily be construed as being in the order in which they are discussed or otherwise presented herein. For example, some blocks may be able to be performed in an alternative ordering, simultaneously, etc.

Although the present invention has been described herein with reference to a number of illustrative embodiments, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. A memory cell, comprising:
a first transistor having a floating channel body and a gate terminal coupled to a first word line; and
a second transistor coupled between the first transistor and a bit line and having a gate terminal to receive a signal from a second word line and another terminal coupled to a source or drain of the first transistor, wherein a turn-on state of the second transistor is controlled to isolate data stored in the floating channel body from a voltage applied to the bit line during a predetermined condition.

2. The memory cell of claim 1, wherein the predetermined condition corresponds to a time when the memory cell is unselected and the bit line is activated during a write operation of a selected memory cell coupled to the bit line.

3. The memory cell of claim 2, wherein the write operation is a write "1" operation.

4. A memory cell, comprising:
a first transistor having a floating channel body; and
a second transistor coupled between the first transistor and a bit line,
wherein a turn-on state of the second transistor is to be controlled to isolate data stored in the floating channel body from a voltage applied to the bit line during a predetermined condition, the predetermined condition corresponding to a time when the memory cell is unselected and the bit line is activated during a write "1" operation of a selected memory cell coupled to the bit line, and
wherein a gate of the first transistor of the unselected cell is to assume a first voltage state during the write "1" operation of the selected memory cell, said first voltage state being higher than a second voltage state the bit line assumes when a write "0" operation is performed for the unselected cell.

5. The memory cell of claim 1, wherein the first and second transistors have opposite polarities.

6. The memory cell of claim 1, wherein the first and second transistors are activated when the first and second word lines assume different voltage states.

7. A memory cell, comprising:
a first transistor having a floating channel body; and
a second transistor coupled between the first transistor and a bit line,
wherein a turn-on state of the second transistor is controlled to isolate data stored in the floating channel body from a voltage applied to a bit line during a predetermined condition, and wherein a gate of the second transistor is to assume a first voltage state when a first value is written into the floating channel body and is to assume a second voltage state when a second value is written in to the floating channel body.

8. The memory cell of claim 1, wherein the gate terminals of the first and second transistors assume a same voltage state when the cell is unselected.

9. The memory cell of claim 1, wherein the gate terminals of the first and second transistors assume different voltage states when the cell is unselected.

10. A memory cell, comprising:
a first transistor having a floating channel body; and
a second transistor coupled between the first transistor and a bit line,
wherein the second transistor provides a level of isolation between the first transistor and the bit line sufficient to allow a gate of the first transistor to assume different voltage states during write "1" and write "0" operations.

11. The memory cell of claim 10, wherein the voltage state of the gate of the first transistor during a write "0" operation is lower than the voltage state of the gate of the first transistor during a write "1" operation.

12. The memory cell of claim 10, wherein the voltage state of the gate of the first transistor during a write "0" operation is lower than a voltage state of the bit line during a write "1" operation.

13. The memory cell of claim 10, wherein a gate of the second transistor assumes a first voltage state during a write "0" operation and a second voltage state during a write "1" operation.

14. The memory cell of claim 13, wherein the first and second voltage states of the second transistor gate are both lower than voltage states of the first transistor gate during write "0" and write "1" operations.

15. The memory cell of claim 13, wherein the second voltage state of the second transistor gate during the write "1" operation is higher than the first voltage state of the second transistor gate during the write "0" operation.

16. The memory cell of claim 10, wherein a voltage state of a gate of the second transistor at least substantially equals a voltage state of the bit line during a write "0" operation.

17. The memory cell of claim 10, wherein a voltage state of a gate of the second transistor is lower than a voltage state of the bit line during a write "1" operation.

18. The memory cell of claim 10, wherein the first and second transistors have opposite polarities.

19. The memory cell of claim 10, wherein the first transistor is controlled by a first word line and the second transistor is controlled by a second word line.

20. The memory cell of claim 19, wherein the first and second transistors are activated when the first and second word lines assume different voltage states.

21. The memory cell of claim 10, wherein a gate of the second transistor assumes a first voltage state during a write "0" operation and assumes a second voltage state during a write "1" operation.

22. The memory cell of claim 21, wherein the second voltage state is higher than the first voltage state.

23. A method for controlling a memory, comprising:
adjusting voltage of a word line to place a cell in an unselected state; and
controlling a circuit between a first transistor of the unselected cell and a bit line, to isolate data stored in a floating body of the first transistor from a voltage applied to the bit line during a predetermined condition, wherein a gate of the first transistor assumes a first voltage state during the write "1" operation of a selected memory cell, said first voltage state being higher than a second voltage state the bit line assumes when a write "0" operation is performed for the unselected cell.

24. The method of claim 23, wherein the predetermined condition corresponds to a time when the bit line is activated during a write "1" operation of a selected memory cell coupled to the bit line.

25. A method for controlling a memory, comprising:
adjusting voltage of a word line to place a cell in an unselected state; and
controlling a circuit between a first transistor of the unselected cell and a bit line, to isolate data stored in a floating body of the first transistor from a voltage applied to the bit line during a predetermined condition, wherein the circuit includes a second transistor having a polarity different from the first transistor and wherein controlling the circuit includes: controlling a turn-on state of the second transistor based on a voltage state of a control line which is separate from the word line.

26. A method of controlling a memory, comprising:
adjusting voltage of a word line to switch a cell between selected and unselected states; and
controlling activation of a circuit between a bit line and a first floating-body transistor in the cell, to provide a level of isolation between the first transistor and bit line sufficient to allow a gate of the first transistor to assume different voltage levels during write "1" and write "0" operations.

27. The method of claim 26, wherein the voltage level of the gate of the first transistor during a write "0" operation is lower than the voltage level of the gate of the first transistor during a write "1" operation.

28. The method of claim 26, wherein the circuit is a second transistor having a polarity opposite to the first transistor.

29. A system, comprising:
a controller; and
a memory cell including:
(a) a first transistor having a floating channel body and a gate terminal coupled to a first word line; and
(b) a second transistor coupled between the first transistor and a bit line, and having a gate terminal to receive a signal from a second word line and another terminal coupled to a source or drain of the first transistor, wherein the controller controls a turn-on state of the second transistor to isolate data stored in the floating channel body from a voltage applied to the bit line.

30. The system of claim 29, wherein the first and second transistors have different polarities.

31. The memory cell of claim 1, wherein said another terminal is a source or drain of the second transistor.

32. The memory cell of claim 1, wherein the gate terminal of the first transistor assumes first voltage state and the gate terminal of the second transistor assumes a second voltage state lower than the first voltage state during a write "1" operation.

33. The memory cell of claim 32, wherein the bit line assumes the first voltage state during the write "1" operation.

34. The memory cell of claim 1, wherein the gate terminal of the first transistor assumes a first voltage state and the gate terminal of the second transistor assumes a second voltage state lower than the first voltage state during a write "0" operation.

35. The memory cell of claim 34, wherein the bit line assumes the second voltage state during the write "0" operation.

36. The memory cell of claim 34, wherein the first voltage state lies between the second voltage state and a third voltage state which the gate terminal of the first transistor assumes during a write "1" operation.

37. The memory cell of claim 1, wherein the gates of the first and second transistors assume a same voltage state during a hold operation.

38. The memory cell of claim 1, wherein the gate terminal of the first transistor assumes a first voltage state and the gate terminal of the second transistor assumes a second voltage state higher than the first voltage state when the memory cell is unselected and another memory cell coupled to the bit line is selected for a write "1" operation.

39. The memory cell of claim 38, wherein the bit line assumes the second voltage state during the write "1" operation of the selected memory cell.

40. The memory cell of claim 1, wherein the gates of the first and second transistors assume a same voltage state when the memory cell is unselected and another memory cell coupled to the bit line is selected for a write "0" operation.

41. The memory cell of claim 40, wherein the bit line assumes a second voltage state lower than said same voltage state during the write "0" operation of the selected memory cell.

42. The memory cell of claim 4, wherein the gate of the first transistor is coupled to a first word line and a gate of the second transistor is coupled to a second word line, and wherein the second transistor is coupled between the first transistor and a bit line and includes a terminal coupled to a source or drain of the first transistor.

43. The memory cell of claim 7, wherein a gate of the first transistor is coupled to a first word line and the gate of the second transistor is coupled to a second word line, and wherein the second transistor is coupled between the first transistor and a bit line and includes a terminal coupled to a source or drain of the first transistor.

* * * * *